US006793301B2

(12) United States Patent
Kaburagi

(10) Patent No.: US 6,793,301 B2
(45) Date of Patent: Sep. 21, 2004

(54) RECORDING APPARATUS

(75) Inventor: Yoshiaki Kaburagi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/969,777

(22) Filed: Oct. 4, 2001

(65) Prior Publication Data

US 2002/0044164 A1 Apr. 18, 2002

(30) Foreign Application Priority Data

Oct. 16, 2000 (JP) ....................................... 2000-315648

(51) Int. Cl.[7] .................................................. H05K 7/16

(52) U.S. Cl. ............................ 347/2; 347/109; 400/88; 399/108

(58) Field of Search ................................ 347/2, 3, 104, 347/108, 109; 400/88, 691; 399/108

(56) References Cited

U.S. PATENT DOCUMENTS 4,308,621 A * 12/1981 Mendelson .............. 455/278.1
5,212,628 A * 5/1993 Bradbury ...................... 400/88
5,831,656 A * 11/1998 Chosa ......................... 347/108

FOREIGN PATENT DOCUMENTS

| | | | |
|---|---|---|---|
| JP | 06-334806 | 12/1994 | H04N/1/00 |
| JP | 10-222975 | 8/1998 | G11B/33/06 |
| JP | 11-027024 | 1/1999 | H01Q/1/22 |
| JP | 2000-79251 A * | 3/2000 | A63F/7/02 |
| JP | 2000-255080 | 9/2000 | B41J/2/175 |
| JP | 2002103734 A * | 4/2002 | B41J/29/00 |

OTHER PUBLICATIONS

Patent Abstracts of Japan, vol. 2000, No. 12 (JP 2000–255080, Sep. 19, 2000), Jan. 3, 2001.

Patent Abstracts of Japan, vol. 1999, No. 04, (JP 11–027024, Jan. 29, 1999).

Patent Abstracts of Japan, vol. 1998, No. 13, (JP 10–222975, Aug. 21, 1998).

Patent Abstracts of Japan, vol. 1995, No. 03, (JP 06–334806, Dec. 2, 1994).

* cited by examiner

*Primary Examiner*—Thinh Nguyen
*Assistant Examiner*—Julian D. Huffman
(74) *Attorney, Agent, or Firm*—Fitzpatrick, Cella, Harper & Scinto

(57) ABSTRACT

A part of the outer casing on the upper surface of a recording apparatus is arranged to be a cover capable of being opened and closed. When the recording apparatus is in operation (in use), the part of this outer casing becomes the sheet feeding tray which is open to stack recording sheets. The recording apparatus is provided with a linear antenna suitable for transmitting and receiving radio waves of ultra-short wave frequency band. The antenna is arranged on the right side of the recording apparatus, observed from the front side thereof, along the edge of the end portion of the cover that dually functions as the sheet feeding tray.

9 Claims, 4 Drawing Sheets

RECORDING APPARATUS

BACKGROUND OF THE INVENTION

1. Field of the Invention

The present invention relates to a recording apparatus provided with a radio data communication interface using radio waves as a transmission carrier.

2. Related Background Art

In recent years, there have been marketed many kinds of portable equipment, such as, for example, portable personal computers, portable telephones, digital cameras, and portable printers. For data transmission between these kinds of portable equipment, a cable connection has been used in most cases conventionally. This conventional approach has been an obstical to more easily utilizing mobile data. Therefore, it is desired for such portable equipment to be able to transmit data between the information equipment without the provision of cables. Then, there is portable equipment conforming to the communication standard using the this infrared rays represented by IrDA. However, the communication ports of the respective portable equipment of infrared communication type should be directed to face each other due to the communicable range having only a directivity of as rigid as ±15 degrees. Also, connection cannot be made if there is any obstacle between the portable equipment to block the infrared rays for the utilization thereof. Thus, the usability thereof becomes unfavorable, and this method of connection is not utilized very often. Under such circumstances, there are developed and made available the regulations of radio communications (Bluetooth, HomeRF, or the like, for example), which make nondirectional radio connection possible between portable equipment by use of "radio waves" as a transmission carrier for utilizing data communications more easily. Bluetooth is for mobile terminal use, while HomeRF is for home use, and the usage thereof is different. However, these regulations make radio communications possible utilizing the 2.4 GHz, which does not require any license. Meanwhile, for the reasons described above, more radio communication technologies and techniques are expected to be developed, besides those developed under such regulations, for data communications between electronic equipment irrespective of the frequency bands.

Now, if the radio communication interface using radio waves of the aforesaid frequency or those of other bands is mounted on a recording apparatus, there is a need for the arrangement of an antenna for an appropriate location of the recording apparatus to receive or transmit radio waves. In order to make it possible to receive radio waves from or transmit them to all the information terminals in a sufficient distance without any dead angle, the sensitivity of reception and transmission must be more than that of the regulated gain both for the vertically and horizontally polarized waves. Consequently, the linear antenna of more than a specific portion is put outside the apparatus away from all metallic components of the apparatus, such as chassis. In many cases, reception gain cannot be obtained if the antenna is buried inside the apparatus. Also, there are such characteristics that the linear antenna put outside the apparatus more than a specific portion can receive horizontally polarized waves if it is arranged horizontally, but it becomes difficult to receive vertically polarized waves. On the other hand, if the antenna is arranged vertically, it can receive vertically polarized waves, but it becomes difficult to receive horizontally polarized waves. The setting angle of the antenna is generally considered favorable if it is approximately at an angle of 45° from the installation surface of the apparatus, although it depends on the mechanical structure of the apparatus and the chassis structure thereof.

FIG. 4 is a view which shows the outer appearance of the conventional portable type recording apparatus in a state of being covered to be carried or stored when it is not in use. FIG. 5 is a perspective view which schematically shows the apparatus in use, observed diagonally from the front side thereof. FIG. 6 is a side view which schematically shows the recording apparatus in use.

When the recording apparatus 31 shown in FIGS. 4 and 5 is used, a recording paper 33 serving as a recording sheet is set on the sheet feeding try 32 arranged to be dually functional as an auto-sheet feeder (automatic sheet feeding device) and a cover for the upper surface of the outer casing as shown in FIG. 4. Inside the recording apparatus 31, a recording head (not shown) is installed. Recording starts on the recording paper 33, while the recording head scans by means of a carriage motor (not shown) in the directions (in the left and right directions in FIG. 5) intersecting the conveying direction of the recording paper. When the recording of one scanning portion is finished, the recording paper 33 is conveyed by means of a sheet feed motor (not shown). Then, the recording of the next scanning portion is performed. When the recording of one page portion is finished, the recording paper 33 is expelled from a sheet expelling port 34. When observed from the sheet expelling port 34 side, an antenna 35 having a designated length is installed on the right edge portion to receive and transmit radio waves. As shown in FIG. 5 and FIG. 6, the user sets up the antenna at a specific angle θ for use. The antenna 35 is housed in the apparatus main body when it is not in use.

Now, however, in accordance with the conventional technologies and techniques described above, the user must set the antenna at a regulated angle for data communications. If the user forgets to set it or sets it but just on the way up to the regulated angle, the communication distance becomes extremely short in a certain direction or there is encountered a problem that a dead angle is brought about so as to disable communications in the worst case. Now, therefore, a structure may be conceivable, as shown in FIG. 7, to fix an antenna on a portion of the outer casing of a recording apparatus at a regulated angle in advance in order to prevent the user from making any erroneous setting thereof. However, the recording apparatus shown in FIG. 7 cannot be put away easily when it is not in use or the antenna is broken eventually when the apparatus is carried for a mobile use.

SUMMARY OF THE INVENTION

In consideration of the problems in the conventional art as discussed above, the object of the present invention is to provide a recording apparatus capable of adopting an antenna structure to obtain sufficient gains of reception and transmission without any dead angle, which makes it unnecessary for the user to set a radio communication interface for the recording apparatus provided therewith.

It is another object of the invention to provide a recording apparatus capable of obtaining sufficient antenna gains both from vertically polarized waves and horizontally polarized waves without any dead angles by means of a radio communication interface and the antenna for receiving and transmitting radio waves which is installed on a part of the outer casing capable of being open in use and closed when the apparatus is not in use.

It is still another object of the invention to provide a recording apparatus having an antenna installed on a member that can be inclined to an angle to enable three performances, the transmission and reception characteristics of the antenna, the sheet feed capability of recording paper, and the size of foot print, to be well-matched in good condition.

DETAILED DESCRIPTION OF THE PREFERRED EMBODIMENTS

Hereinafter, with reference to the accompanying drawings, the embodiment of the present invention will be described.

Figure 1:
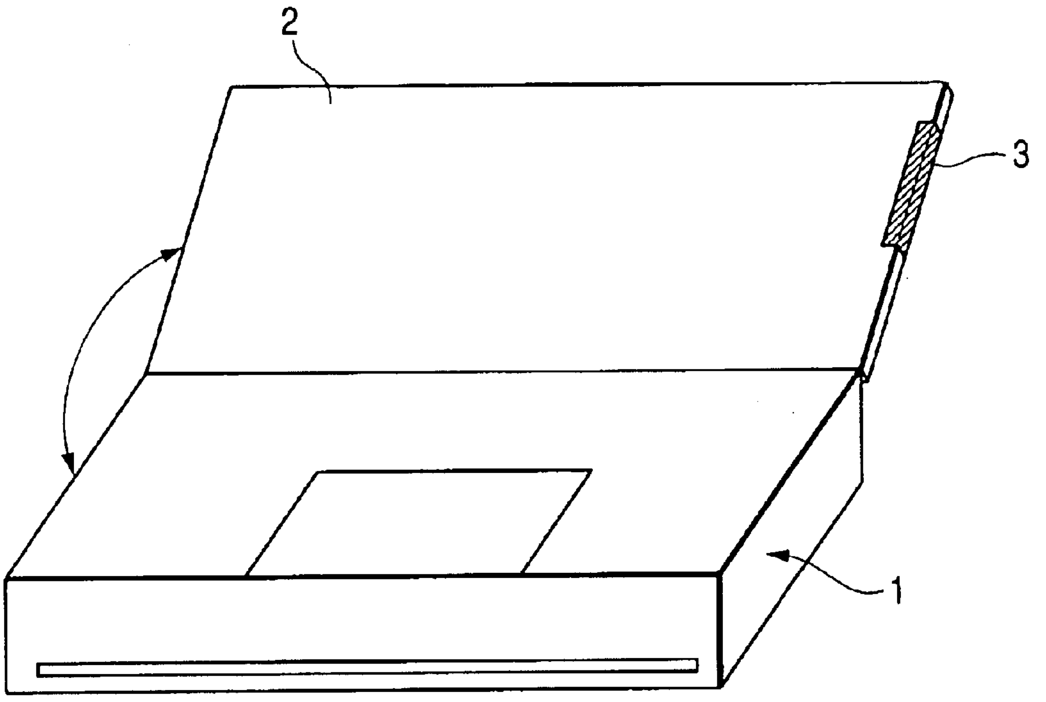
FIG. 1 is a view which shows the outer appearance of a recording apparatus having an antenna arranged on the right edge of the sheet feeding tray thereof embodying the present invention.

FIG. 1 is a perspective view which shows the structure of a recording apparatus in accordance with the present invention.

For the recording apparatus 1 shown in FIG. 1, the upper face of a part of the outer casing of the apparatus main body is a cover that can be opened and closed. This part of the outer casing of the recording apparatus is open as shown in FIG. 1 when the recording apparatus is in operation (in use), and becomes a sheet feeding tray 2 where recording paper serving as a recording sheet is placed individually or in stack. The recording apparatus 1 of the present embodiment is provided with an antenna 3 that transmits and receives radio waves of the ultrashort frequency band which is usually used for wireless LAN. The antenna 3 is a linear antenna preferable to be used for transmitting and receiving ultrashort radio waves. When observed from the front side of the recording apparatus 1, this antenna is arranged on the right side on the edge of the cover that dually serves as the sheet feeding tray 2 with the lengthwise direction of the antenna being aligned with the edge thereof (that is, being arranged along the edge thereof).

Also, the antenna 3 may be arranged to be exposed on the edge of the right side end of the sheet feeding tray 2 or may be arranged to be buried inside the tray.

If the antenna 3 is structured to be exposed, the edge portion of the sheet feeding tray 2 is cut thin and long along the edge of this end portion, and the antenna 3 is arranged in this cut off portion so as to be exposed appropriately.

Also, it is desirable to form the sheet feeding tray 2 with non-metallic material so that it is made possible to obtain sufficient gain of transmission and reception even if the structure should be arranged to bury the antenna 3 inside the right side edge of the sheet feeding tray 2. This is because it is desirable to adopt the antenna arrangement where no metals exist on the left and right and the top and bottom of the antenna.

Figure 2:
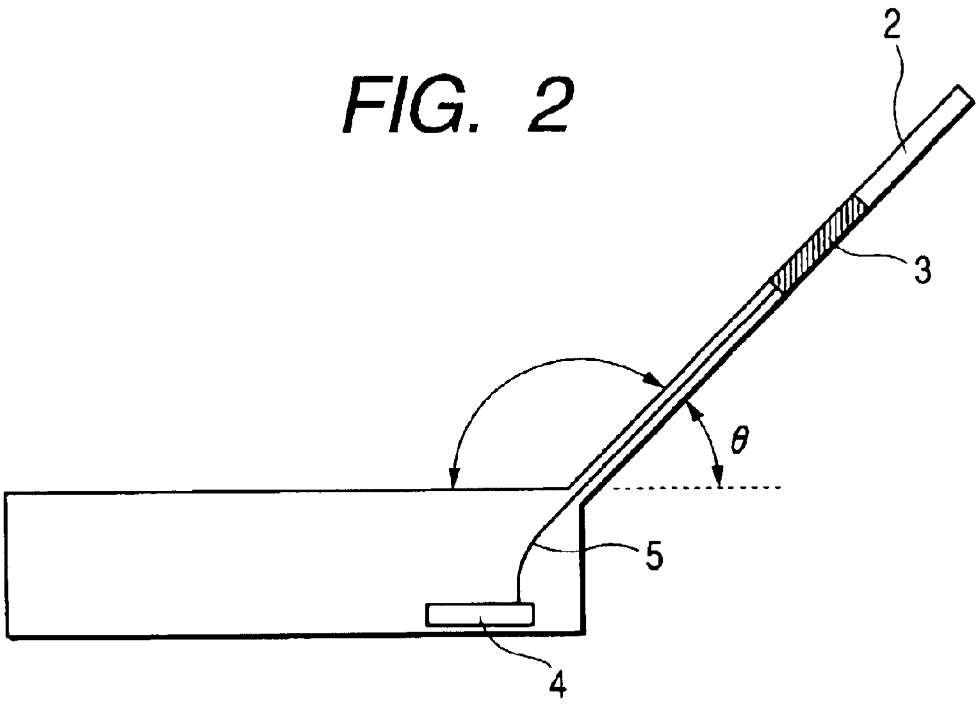
FIG. 2 is a cross-sectional view which shows schematically the communication structure which is characteristic of the recording apparatus represented in FIG. 1.

FIG. 2 is a cross-sectional view which shows the communication structure of the recording apparatus represented in FIG. 1, which is characteristic of the apparatus.

The sheet feeding tray 2 having the antenna 3 arranged therefor is fixed at a specific angle θ to the setting surface of the recording apparatus in use, and functions to stack recording sheets as the sheet feeding tray of an auto-sheet feeder (automatic sheet feed device). The antenna 3 is connected with the RF transceiver circuit 4 arranged inside recording apparatus 1 through the coaxial cable 5 which runs inside the sheet feeding tray 3. The setting angle of the antenna 3, that is, the setting angle θ of the sheet feeding tray 2, should preferably be 45 degrees or around 45 degrees to the setting surface of the recording apparatus in order to satisfy sufficient gains of transmission and reception without any dead angle both to the vertically polarized waves and horizontally polarized waves, although it may vary depending on the chassis structure of a recording apparatus main body.

Figure 3:
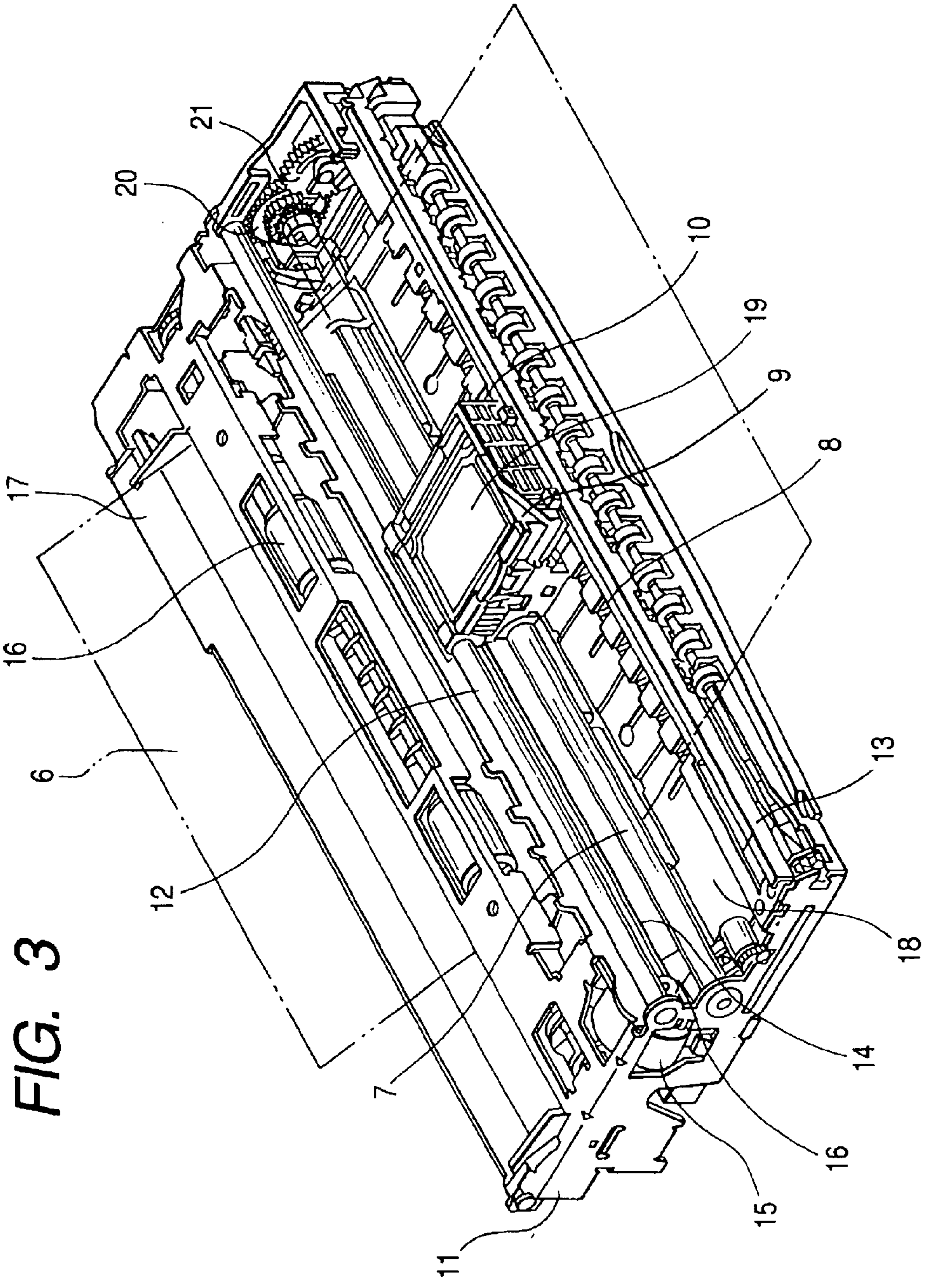
FIG. 3 is a view which schematically shows the structure of the recording portion of an ink jet recording apparatus which is applicable to the recording apparatus of the present invention.
Figure 4:
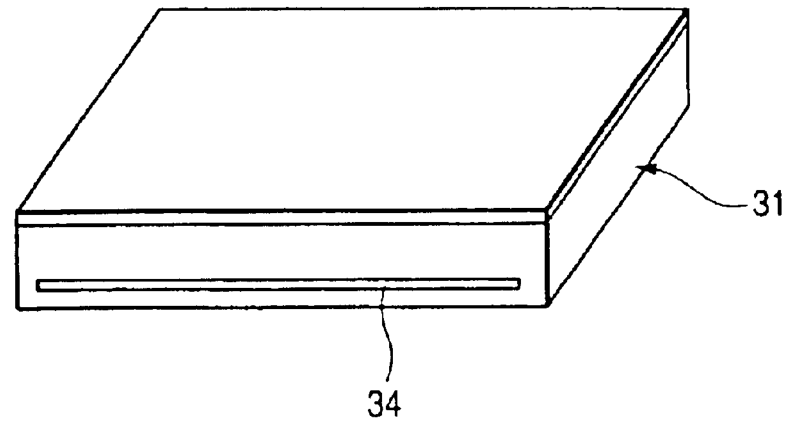
FIG. 4 PRIOR ART
FIG. 4 is a view which shows the outer appearance of the conventional recording apparatus in a state where the sheet feeding tray thereof is closed.
Figure 5:
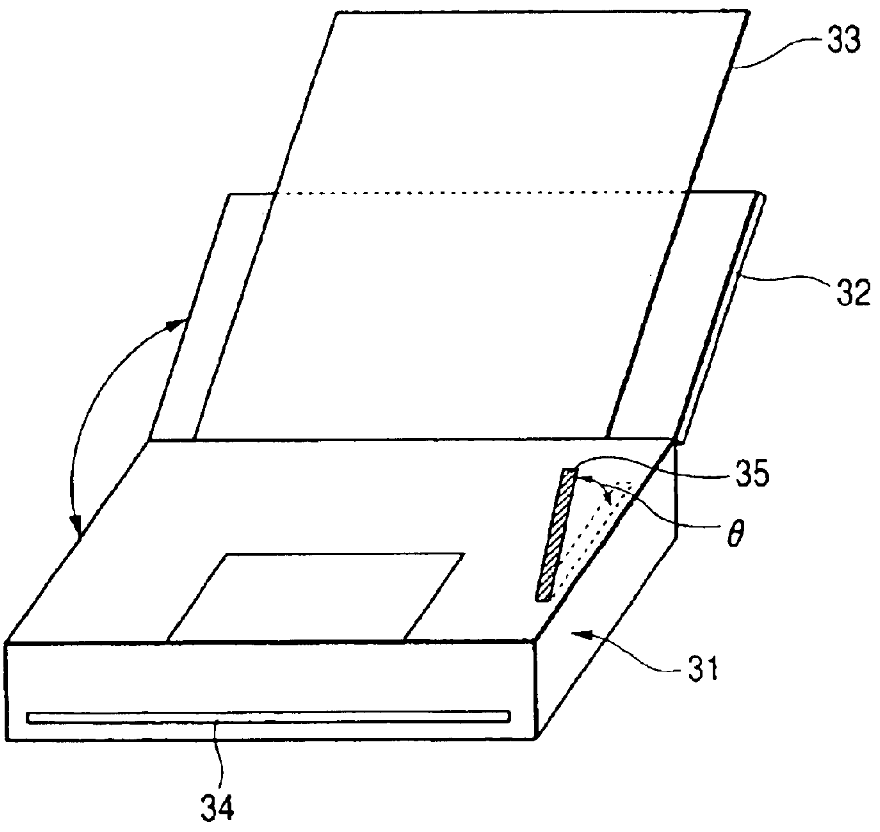
FIG. 5 PRIOR ART
FIG. 5 is a view which shows the outer appearance of the conventional recording apparatus provided with a variable angle antenna on a portion of the main body in a state where the sheet feeding tray is open.
Figure 6:
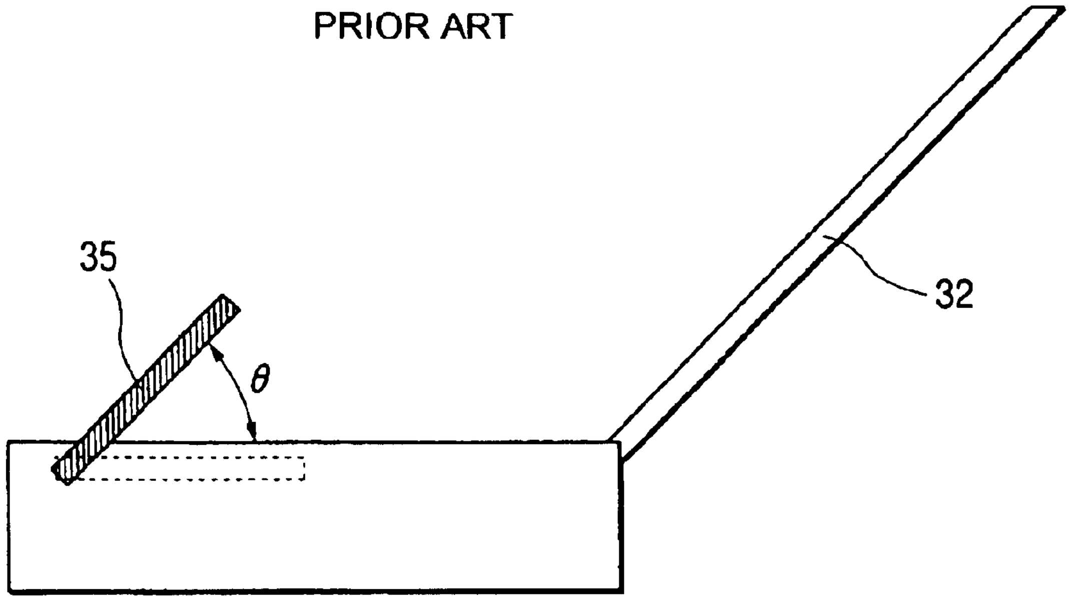
FIG. 6 PRIOR ART
FIG. 6 is a side view which schematically shows the recording apparatus represented in FIG. 5, observed in the crosswise direction thereof.
Figure 7:
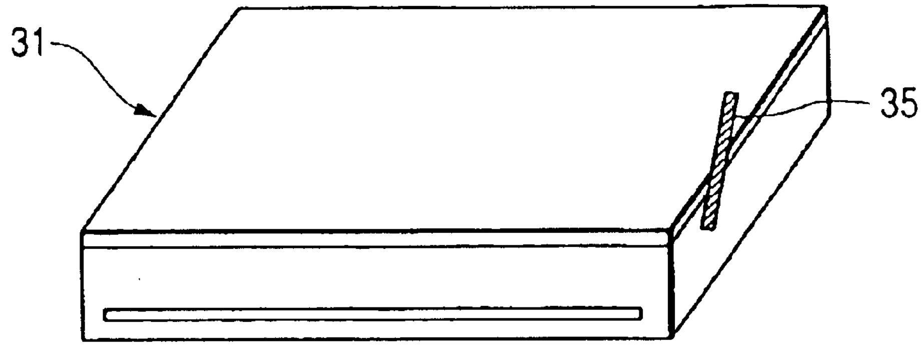
FIG. 7 PRIOR ART
FIG. 7 is a view which shows the outer appearance of the conventional recording apparatus having a fixed areal arranged for the outer side face of the main body thereof.

FIG. 3 is a view which schematically shows the structure of the recording portion of the ink jet recording apparatus which is applicable to the recording apparatus of the present invention.

The ink jet recording apparatus of the mode shown in FIG. 3 comprises a pickup roller 16, a feed roller 7, and a pinch roller 8 for conveying a recording sheet 6, a recording head 9 serving as means for recording on the recording sheet 6, a carriage 10 for mounting the recording head 9 thereon, a guide shaft 12 and a guide rail 13, both ends of which are fixed to a frame 11, for supporting the carriage 10 slidably in the direction parallel to the direction intersecting with (for example, orthogonal to) the conveying direction of the recording sheet 6, and the surface thereof, a carriage driving belt 14 to reciprocate the carriage 10 in the straight line directions, a carriage driving motor 15, a driving pulley 16, a pressure plate 17, and a base 18.

The recording head 9 is structured to be separable from an ink tank 19. On the designated position in the movement of the recording head 9, there are arranged a wiper (not shown) serving as a wiping member for recording droplet discharge ports of the recording head 9, and a cap serving a member to cover the discharge ports.

The pinch roller 8 is biased by use of a spring (not shown) to be pressed to the feed roller 7, and used for conveying the recording sheet 6. On one end of the feed roller 7, a trigger gear (not shown) and an LF gear 20 are axially supported, and, further, a pump gear 21 is arranged to transmit the power from the LF gear 20 to a pump (not shown) through the trigger gear.

It is preferable for the recording head 9 to use one which discharges liquid droplets from nozzles (discharge ports) by utilization of film boiling when thermal energy is applied to liquid, but the present invention is also applicable to the recording head having a mode in which thin film elements are minutely displaced by the input of electric signals thereto, hence discharging liquid droplets from nozzles (discharge ports).

Hereunder, the description will be made of the recording operation of the aforesaid ink jet recording apparatus to a recording sheet 6.

Before recording, the recording sheet 6 is placed on the sheet feeding tray (see at 2 in FIG. 1) and the pressure plate 17. Then, the pickup roller 16 is in a state of being away from the pressure plate 17 by means of a release cam (not shown) installed coaxially with the pickup roller 16.

With the recording sheet 6 being set, the release cam is caused to part from the pressure plate 17 to raise the pressure plate 17 when the driving power of the feed roller 7 is transmitted to the pickup roller 16 and the release cam through gears (not shown), and the pickup roller 16 is in contact with the recording sheet 6. Then, along with the rotation of the pickup roller 16, only one sheet of the recording sheets 6 is separated to be conveyed to the position that faces the recording liquid discharge port formation surface of the recording head 9.

When the recording sheet 6 is conveyed to a designated recording position, the carriage driving motor 15 is driven to rotate the carriage driving belt 14. In this way, the carriage 10 reciprocates in the straight line directions along the guide shaft 12 and the guide rail 13. Then, images (including characters, symbols, and the like) are recorded by the recording head 9 mounted on the carriage 10 in accordance with image signals.

The angle θ of sheet feed setting of the sheet feeding tray (at 2 in FIG. 2) for stacking recording sheets 6 is determined depending on the balance between the sheet feeding performance, and the size of the surface area where the apparatus is installed when the recording apparatus is in use (hereinafter, referred to as a "foot print"). If the setting angle θ of the sheet feeding tray is small, that is, it is close to being horizontal to the setting surface of the apparatus, the feeding of overlapped recording sheets 6 (double feeding of recording sheets) is made more difficult, resulting in a good sheet feeding performance, because it can deal with a thick sheet easily, among some others. However, a larger foot print creates a problem related to usability. On the other hand, if the setting angle θ of the sheet feeding tray is large, that is, it is close to being vertical to the setting surface of the apparatus, the foot print becomes smaller to make the usability favorable, but the double feeding of recording sheets 6 tends to occur, leading to a problem such as to lower the sheet feeding performance, because it becomes difficult to deal with thick sheet. Now, therefore, it is generally practiced to set the sheet feeding tray at an angle within a range of approximately 45° to 60°, although it depends on the concept with which a recording apparatus is structured.

With these in view, it is desirable to make the setting angle θ of the aforesaid sheet feeding tray 45° or around it in order to keep the three performances, the transmission and reception characteristics of the antenna installed on the right edge of the sheet feeding tray shown in FIG. 1 and FIG. 2, the feeding performance of a recording sheet, and the size of the food print, to be well-matched in a better condition.

In this respect, for the recording apparatus of the present embodiment, the installation location of the antenna 3 is on the right edge of the sheet feeding tray, but it is obvious to attain the object of the invention even if the antenna is installed on the left edge or on any other location where the installation thereof does not stand in the way of installing a recording sheet.

Also, for the present embodiment, the sheet feeding tray 2 is exemplified as a part of the outer casing which can be opened and closed and used in a state of being open. However, it may be possible to select any other member than the sheet feeding tray 2 as the installation location of the antenna 3 if only the opening angle thereof is able to keep the three performances, the transmission and reception characteristics of an antenna, the sheet feeding performance of a recording sheet, and the size of foot print, to be well-matched at around an intended setting angle. In this case, it is necessary to align, in the lengthwise direction, a linear antenna serving as the antenna 3 in the direction from the opening and closing center of the member toward the leading edge of such member, which is used in a state of being open. Also, in this case, from the viewpoint of reception sensitivity, it is desirable to use non-metal as structural material of the location where the antenna is installed.

Also, the recording apparatus of the present embodiment is applicable to a printer of the non-portable (installed) type and to a printer of the portable (mobile) type, as well. Also, as one of the examples in which the aforesaid recording apparatus is used for other electronic equipment, it is conceivable that image information is transmitted from a digital camera by radio waves to a printer for obtaining the printout thereof without using any USB cable in-between.

As described above, in accordance with the present embodiment, the structure is arranged so that on a part of the outer casing of the recording apparatus, which can be opened and closed, and used in a state of being open for the performance of recording, and also, provided with a radio communication interface, an antenna is installed for transmitting and receiving radio waves. Then, such part of the outer casing, which can be opened and closed, is set at an angle enabling sufficient antenna gains to be obtained from both vertically polarized waves and horizontally polarized waves without any dead angles. In this way, it becomes possible to prevent the user from making any erroneous setting of the antenna that may result in defective data communications. Further, the antenna can be housed in the outer casing of the recording apparatus when it is not in use and carried to another operating location, hence providing an excellent portable recording apparatus capable of protecting the antenna from being broken.

Particularly for a recording apparatus, a part of outer casing of which is arranged to be opened and closed, and dually functional as a tray for stacking recording sheets to be supplied to the recording unit, the linear antenna portion is installed on the edge portion of such tray, being aligned in the lengthwise direction with the edge in the direction intersecting with the feeding direction of a recording sheet. With the structure thus arranged, the aforesaid effect is attained. In this case, the tray is formed by non-metallic material, and the antenna can be installed on a portion where no metal is present on the left- and right-hand sides and up and down thereof, hence making it possible to obtain an antenna excellent particularly in the characteristics of transmission and reception thereof.

What is claimed is:

1. A recording apparatus comprising:

an outer casing having a recording portion for performing recording on a recording medium in accordance with image information, said outer casing having an open portion through which the recording medium is conveyed to said recording portion;

a tray for supporting the recording medium to be conveyed to said recording portion through said open portion;

a wireless communication interface; and an antenna embedded in said tray along an edge of a side of said tray to receive a radio wave including image information transmitted to said wireless communication interface, wherein said antenna is connected through a cable in said tray to said wireless communication interface, and wherein said tray is fixed at a specific angle with respect to a setting surface of the recording apparatus to support the recording medium, and is able to be closed with respect to said outer casing.

2. A recording apparatus according to claim 1, wherein the recording medium is conveyed to said recording portion in a recording sheet supplying direction, and wherein said antenna is installed along the edge of the end portion of said tray in a direction intersecting with the recording sheet supplying direction.

3. A recording apparatus according to claim 1, wherein the setting angle of said tray to the installation surface of said recording apparatus at the time of using said tray is an angle that orients said antenna so that it is capable of obtaining sufficient antenna gains without dead angles both to vertically polarized waves and horizontally polarized waves, and satisfying the performance of a recording sheet supply to said recording unit.

4. A recording apparatus according to claim 3, wherein the setting angle is approximately 45 degrees.

5. A recording apparatus according to claim 1, wherein said recording apparatus is an ink jet recording printer of a non-portable type or a portable type.

6. A recording apparatus according to claim 5, wherein the ink jet printer performs recording on a recording sheet by use of a recording head discharging liquid from discharge ports.

7. A recording apparatus according to claim 1, wherein said antenna is a linear antenna.

8. A recording apparatus comprising:

an opening and closing member which is a part of an outer housing and openable and closable, said opening and closing member being opened when recording is performed;

a wireless communication interface provided in said recording apparatus; and an antenna embedded in said opening and closing member along an edge of a side of said opening and closing member to receive a radio wave relevant to said wireless communication interface, said antenna being connected through a cable in said opening and closing member to said wireless communication interface, wherein said opening and closing member has a predetermined angle to a mounting surface of said recording apparatus when said opening and closing member is opened.

9. A recording apparatus according to claim 8, wherein said antenna is a linear antenna.

* * * * *

UNITED STATES PATENT AND TRADEMARK OFFICE

CERTIFICATE OF CORRECTION

PATENT NO. : 6,793,301 B2
DATED : September 21, 2004
INVENTOR(S) : Yoshiaki Kaburagi It is certified that error appears in the above-identified patent and that said Letters Patent is hereby corrected as shown below:

Title page,
Item [56], References Cited, FOREIGN PATENT DOCUMENTS,
"2002103734 A" should read -- 2002-103734 A --.

Column 1,
Line 17, "obstical" should read -- obstacle --.
Line 22, "the this" should be deleted.

Column 2,
Line 14, "try" should read -- tray --.

Column 3,
Line 31, "areal" should read -- aerial --.

Signed and Sealed this

Seventeenth Day of January, 2006

JON W. DUDAS
*Director of the United States Patent and Trademark Office*